United States Patent
Pipe

(10) Patent No.: US 8,022,702 B2
(45) Date of Patent: Sep. 20, 2011

(54) MR IMAGING WITH AN RF PULSE PRODUCING REDUCED MAGNETIZATION TRANSFER

(75) Inventor: James Grant Pipe, Glendale, AZ (US)

(73) Assignee: Catholic Healthcare West, California Nonprofit Public Benefit Corporation, Phoenix, AZ (US)

( * ) Notice: Subject to any disclaimer, the term of this patent is extended or adjusted under 35 U.S.C. 154(b) by 22 days.

(21) Appl. No.: 12/620,037

(22) Filed: Nov. 17, 2009

(65) Prior Publication Data

US 2010/0060280 A1    Mar. 11, 2010

Related U.S. Application Data

(62) Division of application No. 11/695,694, filed on Apr. 3, 2007, now Pat. No. 7,635,977.

(60) Provisional application No. 60/744,366, filed on Apr. 6, 2006.

(51) Int. Cl.
    *G01V 3/00*    (2006.01)
(52) U.S. Cl. ........................................ 324/309
(58) Field of Classification Search ........... 324/300–322
    See application file for complete search history.

(56) References Cited

U.S. PATENT DOCUMENTS

| | | | | |
|---|---|---|---|---|
| 5,320,099 A | * | 6/1994 | Roberts et al. | 600/413 |
| 5,339,035 A | * | 8/1994 | Schneider et al. | 324/309 |
| 5,417,214 A | * | 5/1995 | Roberts et al. | 600/413 |
| 6,782,286 B2 | * | 8/2004 | Miyazaki | 600/410 |
| 7,254,437 B2 | * | 8/2007 | Miyazaki | 600/410 |
| 7,308,298 B2 | * | 12/2007 | Miyazaki | 600/410 |
| 7,330,028 B2 | * | 2/2008 | Zhao et al. | 324/309 |
| 7,372,267 B2 | * | 5/2008 | Bieri et al. | 324/307 |
| 2005/0030024 A1 | * | 2/2005 | Golay et al. | 324/307 |
| 2010/0060279 A1 | * | 3/2010 | Pipe | 324/309 |

* cited by examiner

*Primary Examiner* — Dixomara Vargas
(74) *Attorney, Agent, or Firm* — Ziolkowski Patent Solutions Group, SC

(57) ABSTRACT

A system and method are provided herein for designing and transmitting RF pulses which cause a reduced off-resonance magnetization transfer saturation. An RF pulse shape may be optimized according to a set of Bloch solutions defining a desired magnetization profile. An RF pulse may be transmitted according to this optimized shape according to a k-space trajectory which traverses a high amplitude portion of the RF pulse more times than one or more low amplitude portions. In addition, a generally alternating slice select gradient may be applied during transmission of the RF pulse.

11 Claims, 6 Drawing Sheets

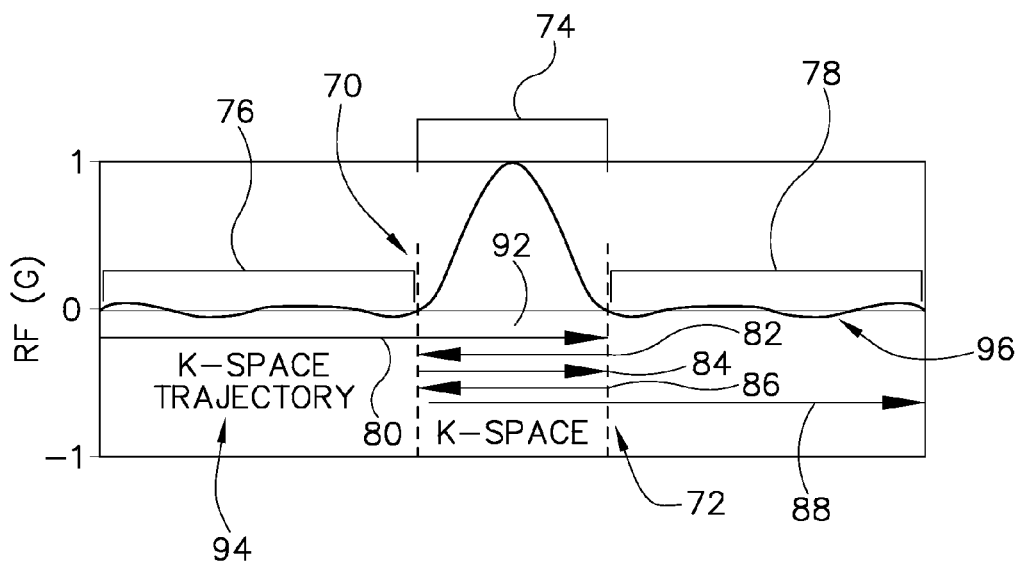
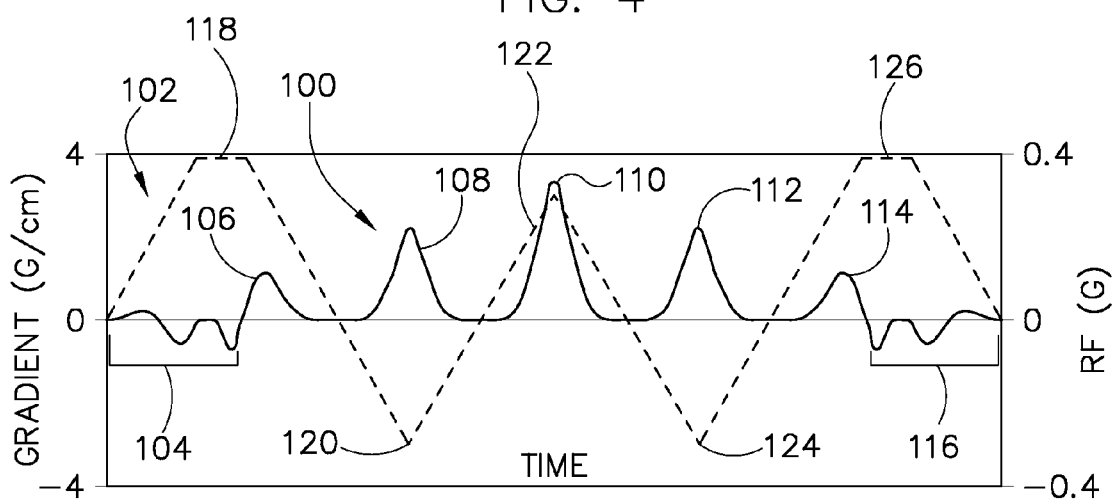

MR IMAGING WITH AN RF PULSE PRODUCING REDUCED MAGNETIZATION TRANSFER

CROSS-REFERENCE TO RELATED APPLICATIONS

The present application is a divisional of, and claims priority to, U.S. application Ser. No. 11/695,694 filed on Apr. 3, 2007, which claimed the benefit of U.S. Provisional Application 60/744,366 filed on Apr. 6, 2006 under 35 U.S.C. §119 (e), the disclosures of which is incorporated herein by reference.

BACKGROUND OF THE INVENTION

The present invention relates generally to magnetic resonance imaging, and more specifically, to a system and method designed to reduce the effects of magnetization transfer on image quality and resolution. By transmitting tailored RF pulses according to particular k-space trajectories, the transfer of magnetization from excited nuclei in a desired slice to nuclei of neighboring slices may be reduced.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

One factor affecting the strength and/or signal to noise ratio (SNR) of these NMR signals is known as "magnetization transfer." Magnetization transfer is the exchange of magnetization between macromolecular or "bound" protons and bulk or "free" protons, most prevalent in water. This exchange can occur, for example, by dipolar interaction or chemical exchange between different tissue types and molecules. Magnetization transfer is generally proportional to transmit power, though it also depends upon other conditions. Since the T2 times of bound protons are generally much shorter than the T2 times of free protons, it can be difficult to directly acquire MR signals from bound protons. Therefore, some processes, typically referred to as "magnetization transfer imaging" (MTI) techniques, use the degree of interaction between bound protons and free protons as an image weighting.

Frequently, however, magnetization transfer can have an adverse effect on image quality and/or SNR of non-MTI imaging. When an RF pulse is applied at a resonant frequency for a given slice, nearby off-resonant bound protons can become saturated due to magnetization transfer. The extent of saturation is dependent upon several factors including the type of tissue of interest, the T1 of the tissue of interest, the T2 of nearby bound spins, and the rate of exchange of magnetization therebetween, but often extends about 10 kHz on either side of the selected slice. The saturation of the off-resonant bound protons can then transfer to free protons of the slice to be imaged, further affecting signal quality. Conversely, when tissues having many bound protons are to be imaged (such as white matter), magnetization transfer can reduce the amount of net magnetization in the tissue(s) of interest and affect the imageability thereof.

One type of pulse which may limit transmit power (SAR), as compared to a conventional sinc pulse, is known as a variable rate selective excitation (VERSE) pulse. VERSE pulses are typically employed as a technique for reducing peak and total power over a high amplitude portion of a pulse sequence. These pulses are usually derived from an RF pulse conventionally shaped for a desired flip angle, duration, and bandwidth. However, the higher amplitude portions of the pulse are then reshaped to reduce peak and total power. As shown in FIG. 1, a VERSE pulse 2 is generally characterized by a lengthened or stretched main lobe 4 that is significantly longer than other lobes 6 of the pulse. Although the RF power is reduced, it is spread over a larger region. As a result, though the MT effect is reduced over the 10 kHz on either side of the slice select location, there are more spins being affected and thus more aggregate MT within that band. During the stretched mainlobe 4, the slice select gradient 8 is reduced. This has the effect of spreading the MT effect over a wider extent in the slice select direction, acting to increase the cumulative MT effect in a multi-slice sequence. This spreading effect mitigates the previously mentioned lowering of MT effects. Thus while VERSE pulses lower SAR, they are still prone to producing MT effects in multi-slice acquisitions, and may therefore produce poor signal quality in certain circumstances.

It would therefore be desirable to have a system and method capable of reducing the occurrence of off-resonance magnetization transfer saturation while maintaining a high signal quality and acceptable specific absorption rate (SAR) for MR imaging.

BRIEF DESCRIPTION OF THE INVENTION

The present invention provides a system and method for overcoming the aforementioned drawbacks. In particular, RF pulses may be optimally designed to reduce or limit the amount of magnetization transfer caused by transmission of the pulses.

Therefore, in accordance with one aspect of the invention, an MR imaging apparatus includes a plurality of gradient coils positioned about a bore of a magnet and an RF transceiver system and switch controlled by a pulse module to transmit and receive signals to and from an RF coil assembly to acquire MR images of a subject within the bore. The apparatus is also provided with a computer that is programmed to create at least one RF pulse to reduce magnetization transfer caused thereby, while maintaining a given flip angle, and to cause transmission of the at least one RF pulse during an MR imaging sequence having an alternating slice-select gradient.

In accordance with another aspect of the invention, the invention provides for a method of MR imaging. The method includes the step of selecting an RF pulse having a profile that includes at least one low amplitude portion and a high amplitude portion, and the step of transmitting the RF pulse during an MR data acquisition sequence such that the high amplitude portion is played out more times than the at least one low amplitude portion.

In accordance with a further aspect of the invention, a computer readable storage medium has a set of instructions stored thereon which, when executed by a computer, causes the computer to determine a desired k-space trajectory to repeatedly traverse at least a portion of an RF pulse profile. The instructions then cause the computer to optimize the RF pulse profile, in an iterative manner, in order to minimize the magnetization transfer which would be caused by the RF pulse profile. The computer is then caused to output the iteratively optimized RF pulse profile for transmission in a RF scan sequence in order to acquire an MR image of a scan subject.

Various other features and advantages of the present invention will be made apparent from the following detailed description and the drawings.

BRIEF DESCRIPTION OF THE DRAWINGS

The drawings illustrate one embodiment presently contemplated for carrying out the invention.

In the drawings:

FIG. 3 is a graph of an exemplary RF pulse profile and k-space trajectory in accordance with one embodiment of the present invention.

FIG. 4 is a graph showing a pulse sequence utilizing the RF pulse profile of FIG. 3.

DETAILED DESCRIPTION OF THE PREFERRED EMBODIMENT

Figure 1:
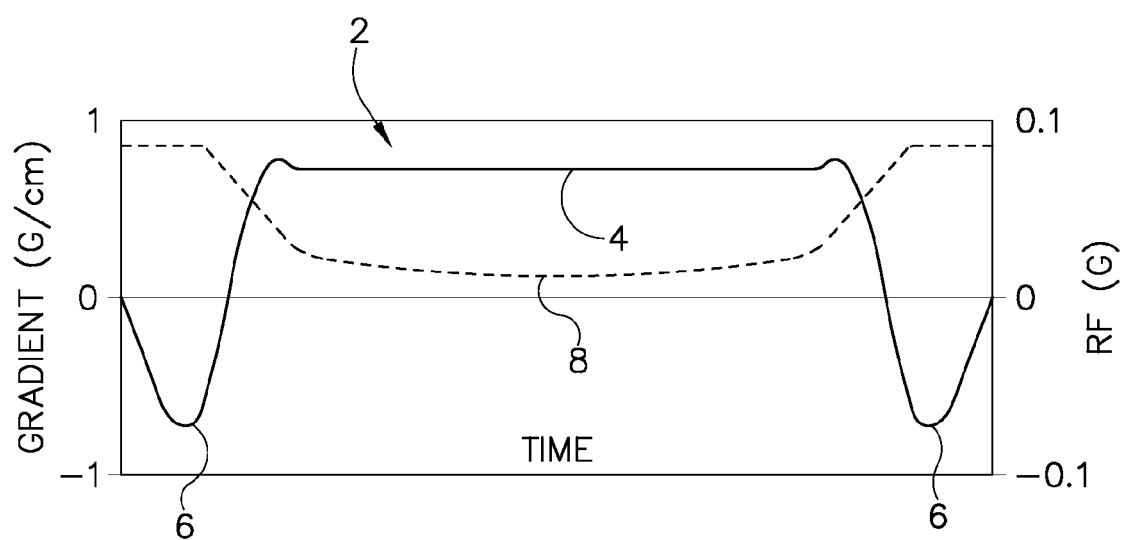
FIG. 1 is a graph of an exemplary known RF pulse profile.
Figure 2:
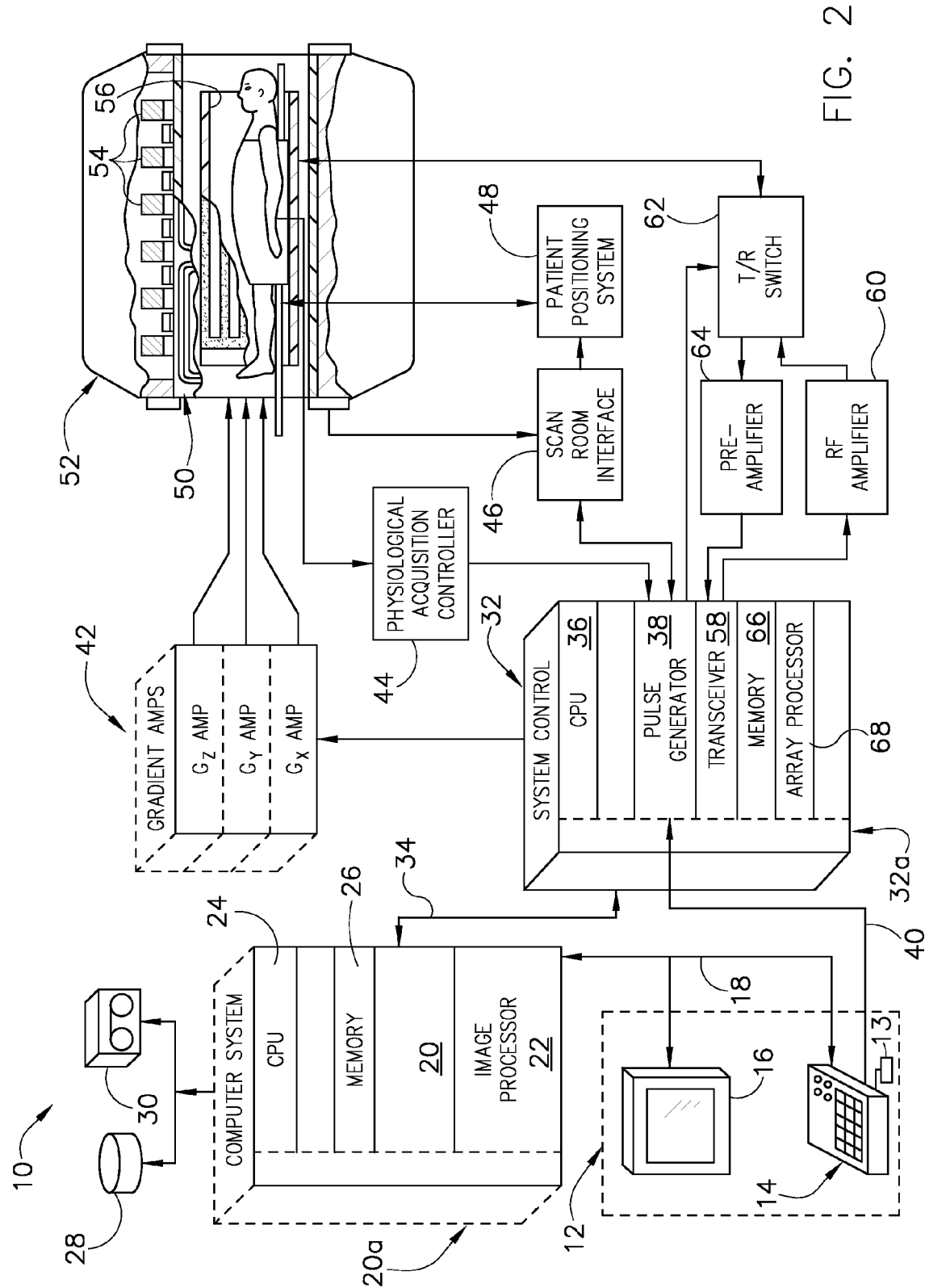
FIG. 2 is a schematic block diagram of an MR imaging system for use with the present invention.

Referring to FIG. 2, the major components of a magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and removable storage 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the removable storage 30, or it may be further processed by the image processor 22 and conveyed to the operator console 12 and presented on the display 16.

Referring now to FIG. 3, an exemplary low-MT RF pulse design and corresponding k-space trajectory are shown, in accordance with one embodiment of the present invention. Various RF pulse sequences, such as spin echo or fast spin echo sequences, transmitted by an RF coil 56 of MR system 10 during a transmit sequence may utilize the design of low- MT RF pulse 70 for image acquisition. For example, RF pulse 70 may be used as a refocusing pulse in a spin-echo (SE) or fast spin echo (FSE) sequence. However, it is understood that a low-MT RF pulse 70 in accordance with embodiments of the invention may be transmitted as an excitation pulse, a refocusing pulse, or many other kinds of pulses. Thus, it is appreciated that RF pulse 70 may find other applications, such as use in diffusion-weighted imaging (DWI), spectral-spatial pulse transmissions, combined spin echo and gradient echo sequences, or other sequences in which it may be desirable to limit magnetization transfer.

As shown, low-MT RF pulse 70 is generally shown with a mainlobe 74 and two sidelobes 76, 78. Mainlobe 74 is characterized by a higher gain than sidelobes 76, 78. It will be appreciated, however, that the MT reduction features of the present invention are applicable to pulses which may not be shaped as shown. For example, other RF pulse profiles which may be designed according to embodiments of the invention may not have one distinct mainlobe and two sidelobes. Generally, RF pulse profiles may have any shape. Thus, discussions referencing the mainlobe 74 of an RF pulse 70 can be extended to include the highest amplitude portion (corresponding to the acquisition of the center of a k-space) of an arbitrarily shaped RF pulse.

In this regard, a center of the particular portion of k-space to be imaged by pulse 70 is considered to be acquired at roughly the center point 92 of mainlobe 74. Thus, as will be discussed below, RF pulse 70 may be played out according to a given k-space trajectory 72 for a given portion of k-space. The k-space trajectory 72 illustrated in FIG. 3 begins by playing out the first sidelobe 76 of RF pulse 70 for a periphery of the k-space 94 and then playing out the mainlobe 74 of RF pulse 70 for the center of the k-space 92. Then, the mainlobe is repeatedly played out 82, 84, 86 for sampling the center of the k-space 92. Finally, the RF pulse is played out 88 over the mainlobe 74, once again for the center of the k-space 92, and the second sidelobe 78 for a periphery of the k-space 96. Thus, in one embodiment, the first sidelobe 76 may be played out once, the mainlobe 74 may be played out five times, and the second sidelobe 78 may be played out once. One of skill in the art will appreciate that the duration, amplitude, and shape of the lobes 74, 76, 78 may be designed to distribute a total flip angle over the transmission of the lobes 74, 76, 78, affecting a signal quality or strength, over both spatial and spectrally defined regions, for the various k-space samplings.

Referring now to FIG. 4, a graph of the low-MT RF pulse 70 of FIG. 3 is shown, as played out according to the k-space trajectory 94 of FIG. 3. Thus, the low-MT RF pulse 100 of FIG. 4 generally displays a first sidelobe portion 104, five "mainlobe" portions 106-114, and a second sidelobe portion 116. First sidelobe portion 104 of FIG. 4 is played out for the peripheral k-space region 94 of FIG. 3. Mainlobe portions 106-114 of FIG. 4 are played out for the central k-space region 92 of FIG. 3. As shown in FIG. 4, mainlobe portions 106 and 114 have a lower amplitude than the other mainlobe portions 108-112, and mainlobe portion 110 has the highest amplitude. Therefore, since the total flip angle effected by RF pulse 70 is spread among several mainlobe portions 106-114, the transmit power of RF pulse 70 does not need to be reduced in order to reduce SAR or off-resonance magnetization transfer saturation. For example, if low-MT RF pulse 70 were to be used as a refocusing pulse having a desired 180 degree flip angle, the total transmit power could remain at 180 degrees (spread over lobes 106-114) yet the off-resonance magnetization transfer saturation would be significantly less than that caused by a common sinc or Shinnar-LeRoux based 180 degree RF pulse design. As a different example, if low-MT RF pulse 70 were to be used as a refocusing pulse having a desired 120 degree flip angle, the total transmit power of over the course of playing out RF pulse 70 could remain at 120 degrees, yet the off-resonance magnetization transfer saturation would be significantly less than that caused by a typical 120-degree RF pulse and less even than a 180 degree low-MT RF pulse.

During the transmission of RF pulse 100 of FIG. 4, an alternating slice-select gradient (Gz) 102 is applied. It is contemplated that some or all of the gradient waveform 102 may alternate at a maximum slew rate. When first sidelobe portion 104 is transmitting, Gz gradient increases to a first positive peak 118 and momentarily plateaus. When the first mainlobe portion 106 is transmitting, Gz begins decreasing towards a first negative peak 120. During transmission of the second mainlobe portion 108, Gz begins increasing from negative peak 120. When third mainlobe portion 110 is transmitting, Gz reaches a second positive peak 122. Thereafter, Gz decreases to a second negative peak 124 during transmission of fourth mainlobe portion 112, increases to a third positive peak 126 during transmission of fifth mainlobe portion 114, briefly plateaus, then decreases during transmission of the second sidelobe portion 116. As can be seen, the transmission of RF pulse 100 and Gz gradient 102 is substantially symmetrical on either side of third mainlobe portion 110. By playing out an optimized RF pulse similar to RF pulse 100 during an alternating slice-select gradient, such as Gz 102, magnetization transfer caused by the pulse can be limited. As known in the art, when subject anatomy outside the slice profile (i.e. off-resonant anatomy) and/or non-target tissues are not saturated by magnetization transfer, the resulting signal quality from the subject anatomy within the field of view and/or from target tissues may exhibit improved contrast.

The shape of RF pulse 100 and the behavior of Gz gradient 102 are specifically defined prior to transmission in order to control the magnetization profile thereof for each location in k-space along the desired k-space trajectory. In other words, RF pulse 100 can be shaped so that the change in magnetization effected at each point during its transmission conforms to a desired result. As known in the art, the change in magnetization due to an RF transmission in a given magnetic field can be described by the Bloch equations. One expression of the Bloch equations, solving for the change in longitudinal magnetization ($M_z$) and transverse magnetization ($M_x$ and $M_y$), is given by:

$$\frac{\partial M_z}{\partial t} = -\omega_1 M_{y'} + \frac{M_0 - M_z}{T_1} \qquad \text{Eqn. 1}$$

$$\frac{\partial M_{x'}}{\partial t} = (\omega_0 - \omega) M_{y'} - \frac{M_{x'}}{T_2} \qquad \text{Eqn. 2}$$

$$\frac{\partial M_{y'}}{\partial t} = -(\omega_0 - \omega) M_{x'} + \omega_1 M_z - \frac{M_{y'}}{T_2} \qquad \text{Eqn. 3}$$

where $\omega_0 = 2\pi\gamma B_0$ and $\omega_1 = 2\pi\gamma B_1$. Therefore, a desired magnetization which limits magnetization transfer can be used as a set of solutions to the Bloch equations to define an RF pulse for general use or specifically adapted to a given scan prescription. It is contemplated that a pulse defined in accordance with embodiments of the invention may be 1D or multi-dimensional spatially-selective. In general, however, defining the RF pulse to increase in gain, then decrease in gain for acquisition of the k-space center, during an alternating gradient, aids in reducing off-resonance saturation or magnetization transfer.

The shaping of an RF pulse profile can be achieved by iteratively optimizing a multi-order polynomial defining the RF pulse profile. That is, a vector of coefficients corresponding to the variables of a multi-order polynomial can be adjusted during a series of iterations to shape an RF pulse. The polynomial can be compared in each iteration to a desired set of solutions to the Bloch equations for all or a number of points along the RF pulse profile. Depending upon the comparison, the coefficients may be increased or decreased to drive the polynomial towards satisfying the desired solutions along some or all points of the RF pulse. Alternatively, two or more polynomials may be iteratively optimized to separately define the sidelobe portions and the mainlobe. Or, since an optimized RF pulse may generally be symmetric, one polynomial may be optimized for half of the pulse, or some other portion thereof, and then reflected to represent the full pulse or pulse portion. For example, in one embodiment, one fifth-order polynomial may be defined to describe one sidelobe portion of an RF pulse and another fifth-order polynomial may be defined to describe half of the mainlobe. The inverse of these polynomials may then be used to describe the other sidelobe portion and the other half of the mainlobe, respectively.

Figure 5:
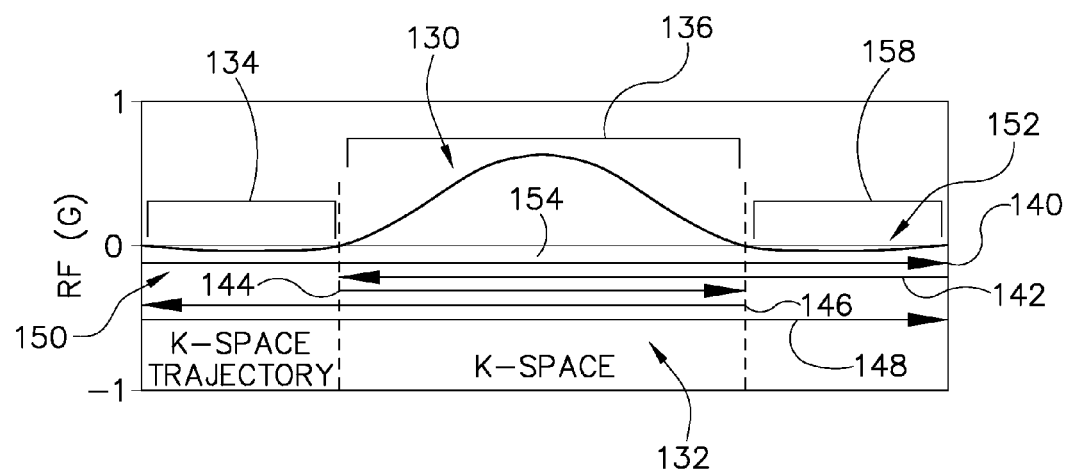
FIG. 5 is a graph of another exemplary RF pulse profile and k-space trajectory in accordance with a further embodiment of the present invention.

As one skilled in the art will appreciate, RF pulses optimized in accordance with the above-described technique can vary not only according to the desired magnetization characteristics, but also according to the desired k-space trajectory. As shown in FIG. 5, an RF pulse 130 may also be optimized according to k-space trajectories other than that shown in FIG. 3. The k-space trajectory 132 shown in FIG. 5 generally plays out a first sidelobe 134 of RF pulse 130 three times, a mainlobe 136 five times, and a second sidelobe 138 three times. In other words, RF pulse 130 may be designed to produce an MR signal corresponding to a given portion or segment of k-space such that a first periphery of the k-space segment 150 is sampled three times, a center of the k-space 154 segment is sampled five times, and a second periphery of the k-space segment 152 is sampled three times. As shown, the k-space trajectory 132 plays out the entire RF pulse 130 in a first pass 140 for a periphery 150, 152 and a center 148 of k-space. Then, the trajectory plays out the second sidelobe 138 and the mainlobe 136 in a second pass 142. The mainlobe 136 is then played out again during a third pass 144, followed by a fourth pass 146 playing out the mainlobe 136 and the first sidelobe 134. Finally, the RF pulse 130 is again played out in its entirety in a fifth pass 148.

Figure 6:
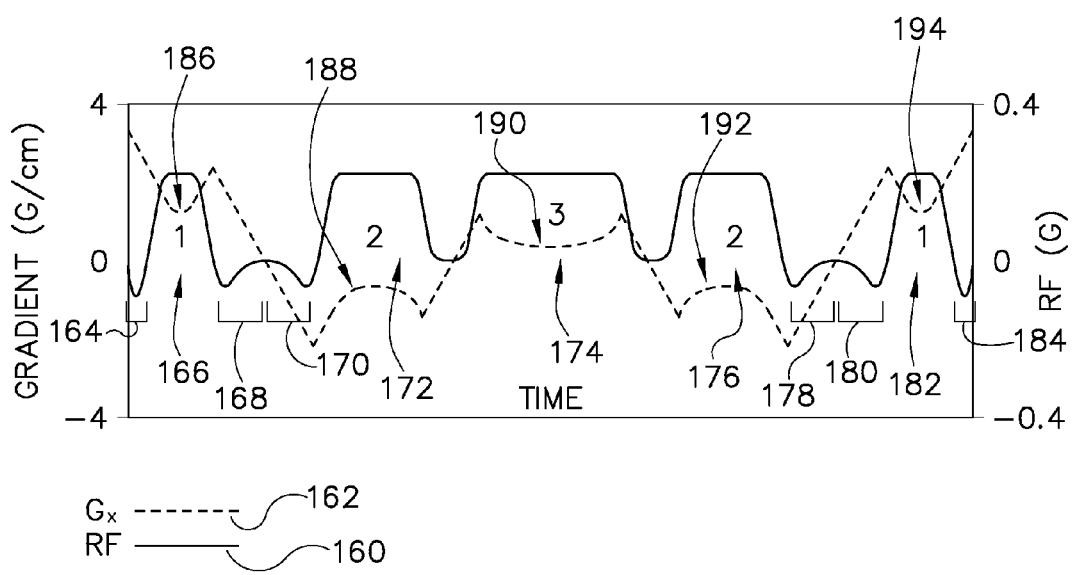
FIG. 6 is a graph showing a pulse sequence utilizing the RF pulse profile of FIG. 5.

A plot of the RF pulse 130 of FIG. 5, as played out according to the k-space trajectory 132, is shown in FIG. 6. RF pulse 160 begins by playing out a first sidelobe portion 164, a mainlobe portion 166, and a second sidelobe portion 168, corresponding to the first pass of the k-space trajectory of FIG. 5. Next, RF pulse 160 is then played out for another second sidelobe portion 170 followed by another mainlobe portion 172, corresponding to the second pass of the k-space trajectory of FIG. 5. RF pulse 160 is then played out for a third mainlobe portion 174, corresponding to the third pass of the k-space trajectory of FIG. 5. RF pulse 160 is again played out for a mainlobe portion 176 followed by a first sidelobe portion 178, corresponding to the fourth pass of the k-space trajectory of FIG. 5. Finally, RF pulse 160 is played out for a first sidelobe portion 180, a mainlobe portion 182, and a second sidelobe portion 184, corresponding to the fifth pass of the k-space trajectory of FIG. 5. In the embodiment shown, the total flip angle caused by transmission of RF pulse 160 is distributed over the mainlobe portions 166, 172, 174, 176, 182 by factors of 1/9, 2/9, 3/9, 2/9, 1/9, respectively. This distribution is effectuated in the illustrated embodiment by varying the pulse widths or durations of the mainlobe portions, though it is appreciated that flip angle distribution may be effectuated by other techniques. The total flip angle of RF pulse 160 is equivalent to that of a common sinc pulse designed for imaging or refocusing the same nuclei.

During transmission of an RF pulse in accordance with the present invention, a modified alternating slice-select gradient (Gz) 162 is applied, preferably coincidently therewith. Gz gradient 162 begins in a decreasing slope during transmission of the first sidelobe portion 164, but exhibits a dip in magnitude 186 during transmission of mainlobe portion 166. Gz gradient 162 then resumes a downward slope during transmission of the two second sidelobe portions 168, 170. Gz gradient 162 begins increasing during transmission of the mainlobe portion 172, but exhibits another dip in magnitude 188. Similarly, Gz gradient 162 dips in magnitude 190 during application of mainlobe portion 174, and then decreases before transmission of the mainlobe portion 176. During transmission of mainlobe portion 176, Gz gradient 162 again dips in magnitude 192, before increasing over the two first sidelobe portions 178, 180. Gz gradient 162 also exhibits a dip in magnitude during transmission of mainlobe portion 182. Due to these dips in magnitude of the Gz gradient 162 during transmission of the mainlobe portions, the RF pulse 160 can maintain a relatively flattened shape or constant amplitude during the temporal transmission, reducing peak RF power and SAR in a manner similar to that of a VERSE pulse.

Figure 7:
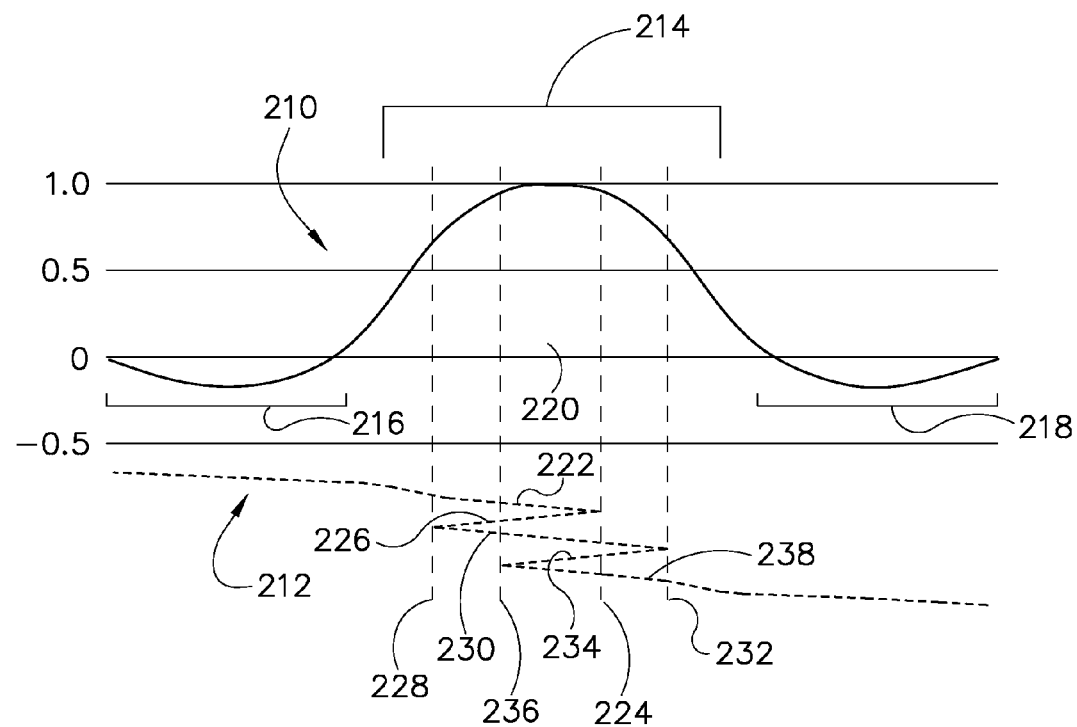
FIG. 7 is a graph of another exemplary RF pulse profile and k-space trajectory in accordance with a further embodiment of the present invention

Referring now to FIG. 7, a graph of an RF pulse profile 210 and a corresponding k-space trajectory 212 are shown. In the example shown, RF pulse profile 210 generally has a high-amplitude portion or mainlobe 214 and low amplitude portions or sidelobes 216, 218. The maximum amplitude of RF pulse profile 210 occurs for the acquisition of a k-space origin 220. In contrast to the k-space trajectories discussed above, the trajectory 212 of FIG. 7 repeatedly plays out only segments of the high amplitude portion 214, rather than the entire high amplitude portion 214. That is, trajectory 212 acquires k-space such that the RF pulse profile 210 is played out over the first low amplitude portion 216 and for a first segment 222 of the high amplitude portion 214, to a first point 222. From there, the trajectory 212 plays out a second segment 226 of the high amplitude portion 214, between the first point 22 and a second point 228. The trajectory 214 then plays out a third segment 230 of the high amplitude portion 214, between the second point 228 and a third point 232. Similarly, a fourth segment 234 is played out between the third point 232 and a fourth point 236 and a fifth segment 238 is played out from the fourth point 236 through the second low amplitude portion 218. Thus, it will be appreciated that the high amplitude portion 214 of an RF pulse profile 210 can be played out in segments. That is, embodiments need not play out the high amplitude portion of an RF pulse profile repeatedly in its continuous entirety in order to achieve the reduced MT advantages of the present invention. A high amplitude portion can be played out in any desired segments any number of times, according to the desired reduction in MT, the desired pulse duration, the desired flip angle, and the like.

Figure 8:
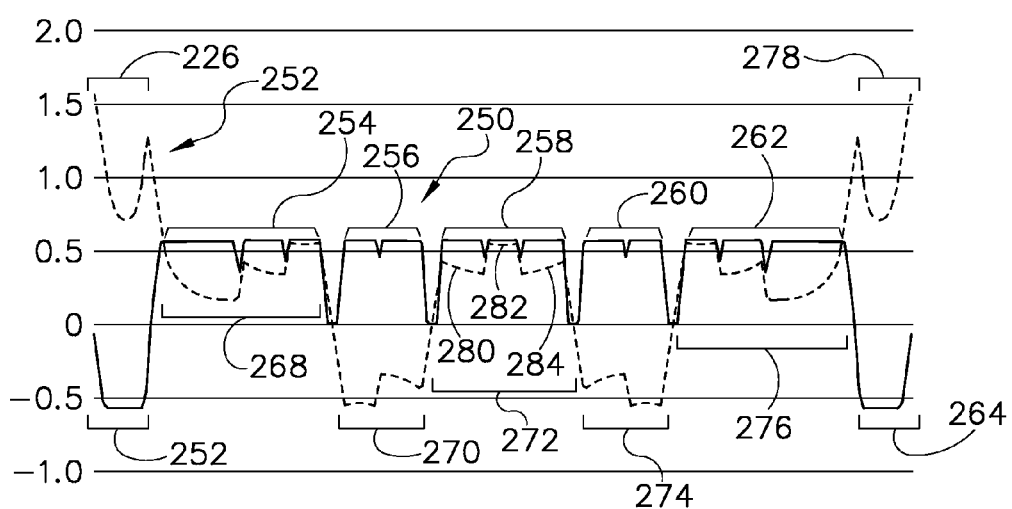
FIG. 8 is a graph showing a pulse sequence utilizing the RF pulse profile of FIG. 3.
Figure 9:
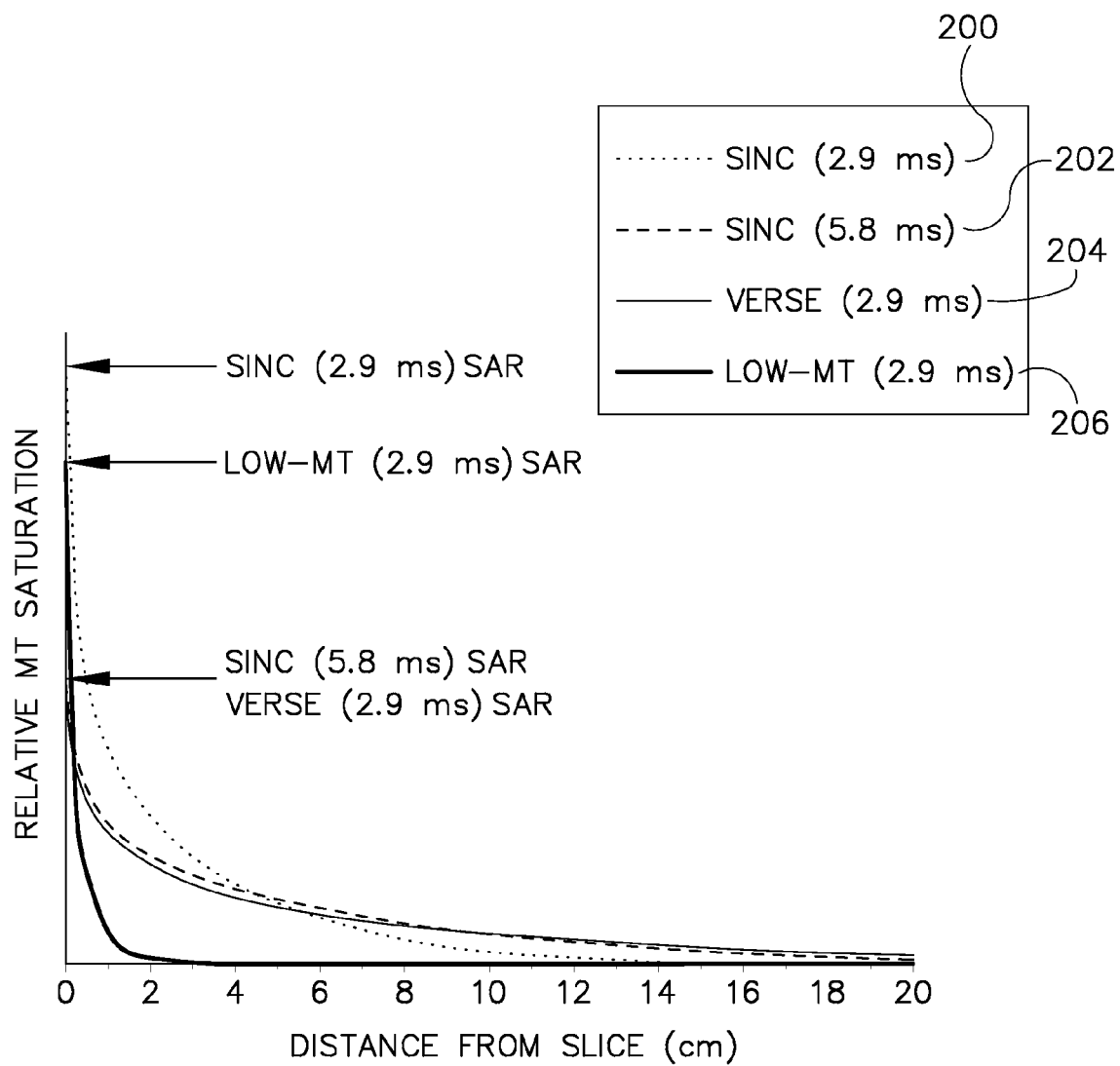
FIG. 9 is a plot of relative magnetization transfer saturation over distance for a number of RF pulse techniques.

FIG. 8 depicts a time-domain plot 250 of the RF pulse profile 210 of FIG. 7 being transmitted in the presence of a slice-select gradient waveform 252. As shown, a low-amplitude portion 252 of the RF pulse is transmitted first, followed by a segment 268 corresponding to the high amplitude portion 214 of the RF pulse 210 of FIG. 7, extending to first point 224. Next, the RF pulse 250 of FIG. 8 is transmitted for a second segment 256, corresponding to the high amplitude portion 214 of the RF pulse 210 of FIG. 7 extending between the first point 224 and the second point 228. The RF pulse 250 of FIG. 8 is then transmitted for a third segment 258, corresponding to the high amplitude portion 214 of the RF pulse 210 of FIG. 7 extending between the second point 228 and the third point 232. Accordingly, as shown in FIG. 8, segment 258 is longer than segment 256, but shorter than segment 268. Similarly, RF pulse 250 is transmitted for a fourth segment 260, a fifth segment 262, and a low amplitude portion 264 corresponding to the trajectory of FIG. 7 extending between the third 232 and fourth 236 points, and from the fourth point 236 through the low amplitude portion 218.

The slice-select gradient waveform 252 of FIG. 8 is generally alternating in amplitude during the high amplitude segments 254-262 of the RF pulse 250, and higher in amplitude during the low amplitude segments 252, 264 of the RF pulse 250. That is, gradient waveform 252 has a high amplitude 266 during the first low amplitude RF segment 252, then a lower positive amplitude 268 during the first high amplitude RF segment 268. The gradient waveform 252 then exhibits a negative amplitude 270 during the second high amplitude RF segment 270. Similarly, the gradient waveform 252 alternates between a positive amplitude 272, a negative amplitude 274, and a positive amplitude 276 during transmission of the third, fourth, and fifth RF segments 258-262. The waveform 252 then increases during transmission of the second low amplitude RF segment 264.

In addition, gradient waveform 252 exhibits more minor changes in amplitude within the transmission of each RF segment. For example, during transmission of high amplitude segment 258 of RF pulse 250, the slice-select gradient has a gently decreasing region 280, then an increased region 282, then a gently increasing region 284 mirroring the decreasing region 280. By varying the gradient as such, the RF segment 258 can be maintained at a relatively constant and reduced power. In other words, in a manner similar to a VERSE pulse, peak RF power and SAR can be reduced.

Embodiments of the present invention utilizing RF pulses designed for low magnetization transfer have been tested and validated. Referring now to FIG. 7, a graph of magnetization transfer saturation at off-resonance locations compares tested results for a number of RF pulse designs is shown. A common sinc pulse 202 having a 5.8 ms duration causes significant magnetization transfer saturation at distances up to 14 cm on either side of the imaging slice, and still causes some magnetization transfer saturation even beyond 20 cm. A sinc pulse 200 having a 2.9 ms duration causes very little magnetization transfer saturation beyond about 10-12 cm on either side of the imaging slice. In contrast, a VERSE pulse of a 2.9 ms duration causes magnetization transfer saturation comparable to a 5.8 ms sinc pulse. However, a low-MT RF pulse designed in accordance with embodiments of the present invention described herein causes very little magnetization transfer saturation between 1-2 cm and virtually no magnetization transfer thereafter.

Accordingly, a system and method have been disclosed, in a number of embodiments, for designing RF pulses to cause a reduced or limited amount of off-resonance magnetization transfer saturation. As set forth above, an RF pulse may be defined in a k-space domain and a k-space trajectory may be chosen which traverses at least a segment of the high amplitude part of the RF pulse multiple times. When the RF pulse is mapped into the time domain, the error between the magnetization caused by the RF pulse and the desired target magnetization can be found using the Bloch equations. Thus, the pulse profile can be iteratively adjusted to optimize its magnetization profile, while maintaining a given flip angle and a reduced magnetization transfer. These pulses may be used in a number of acquisition sequences to improve signal quality and reduce blurring or other artifacts caused by off-resonance magnetization transfer saturation.

In particular, one embodiment of the invention includes an MR imaging apparatus which has a plurality of gradient coils positioned about a bore of a magnet and an RF transceiver system and switch that are controlled by a pulse module to transmit and receive signals to and from an RF coil assembly to acquire MR images of a subject within the bore. The MR apparatus also has a computer that is programmed to create at least one RF pulse such that the pulse causes reduced magnetization transfer, while maintaining a given flip angle. The computer is further programmed to cause the at least one RF pulse to be transmitted during an MR imaging sequence having an alternating slice-select gradient.

In another embodiment, the invention provides a method for MR imaging. The method includes selecting an RF pulse having a profile that includes at least one low amplitude portion and a high amplitude portion, and transmitting the RF pulse during an MR data acquisition sequence such that the high amplitude portion is played out more times than the at least one low amplitude portion.

A further embodiment of the invention includes a computer readable storage medium which has a set of instructions stored thereon. The instructions, when executed by a computer, cause the computer to determine a desired k-space trajectory to repeatedly traverse at least a portion of an RF pulse profile. The instructions further cause the computer to optimize the RF pulse profile, in an iterative manner, in order to minimize the magnetization transfer which would be caused by the RF pulse profile. The computer is then caused to output the iteratively optimized RF pulse profile for transmission in a RF scan sequence in order to acquire an MR image of a scan subject.

The present invention has been described in terms of the preferred embodiment, and it is recognized that equivalents, alternatives, and modifications, aside from those expressly stated, are possible and within the scope of the appending claims.

What is claimed is:

1. A computer readable storage medium having a set of instructions stored thereon which, when executed by a computer, causes the computer to:
   determine a desired k-space trajectory to repeatedly traverse at least a portion of an RF pulse profile;
   iteratively optimize the RF pulse profile to minimize magnetization transfer caused thereby; and
   output the iteratively optimized RF pulse profile for transmission in an RF scan sequence in order to acquire an MR image of a scan subject.

2. The computer readable storage medium of claim 1 wherein the set of instructions further causes the computer to define the RF pulse profile to have a high amplitude portion and at least one low amplitude portion, and wherein the portion of the RF pulse profile repeatedly traversed by the k-space trajectory corresponds to at least a segment of the high amplitude portion.

3. The computer readable storage medium of claim 2 wherein the set of instructions further causes the computer to correlate a reduced gradient with transmission of at least one segment of the high amplitude portion.

4. The computer readable storage medium of claim 3 wherein the reduced gradient is a reduced alternating slice-select gradient.

5. The computer readable storage medium of claim 2 wherein the set of instructions further causes the computer to call for transmission of an RF pulse in accordance with the RF pulse profile such that the high amplitude portion is played out more times than the at least one low amplitude portion is played out.

6. The computer readable storage medium of claim 5 wherein the high amplitude portion is played out with increasing and then decreasing power.

7. The computer readable storage medium of claim 1 wherein the RF pulse is designed for improving image contrast of white matter.

8. The computer readable storage medium of claim 1 wherein the set of instructions further causes the computer to define the RF pulse profile by defining a first multi-parameter polynomial for a region of the profile corresponding to a high amplitude and defining a second multi-parameter polynomial for a region of the profile corresponding to a lower amplitude.

9. The computer readable storage medium of claim 8 wherein the set of instructions further causes the computer to iteratively optimize the first multi-parameter polynomial and the second multi-parameter polynomial at least in part by solving a set of Bloch equations.

10. The computer readable storage medium of claim 1 wherein the set of instructions further causes the computer to:
 acquire MR data from the scan subject; and
 reconstruct an MR image of the scan subject from the MR data.

11. The computer readable storage medium of claim 1 wherein the desired k-space trajectory is designed to traverse back and forth across unequal segments of the portion of the RF pulse.

* * * * *